United States Patent [19]
Gürtler et al.

[11] Patent Number: 5,475,719
[45] Date of Patent: Dec. 12, 1995

[54] METHOD AND DEVICE FOR ACCURATE PHASE SWITCHING OF SIMILAR PULSE TRAINS HAVING DIFFERENT PHASE POSITIONS

[75] Inventors: Michael O. Gürtler, Gattikon; Rolf Beerenwinkel, Zürich, both of Switzerland

[73] Assignee: Alcatel N.V., Amsterdam, Netherlands

[21] Appl. No.: 255,772

[22] Filed: Jun. 7, 1994

[30] Foreign Application Priority Data

Jun. 7, 1993 [CH] Switzerland ............... 01696/93

[51] Int. Cl.$^6$ ................................................ H03D 3/24
[52] U.S. Cl. ....................... 375/376; 331/11; 331/12; 331/14; 331/25
[58] Field of Search ................ 375/376; 331/11, 331/12, 14, 25

[56] References Cited

U.S. PATENT DOCUMENTS

| | | |
|---|---|---|
| 4,511,859 | 4/1985 | Dombrowski ............... 331/11 |
| 4,688,205 | 8/1987 | Akiko ............... 331/11 |
| 5,208,740 | 5/1993 | Ehsani ............... 363/124 |

Primary Examiner—Stephen Chin
Assistant Examiner—Huong Luu
Attorney, Agent, or Firm—Spencer, Frank & Schneider

[57] ABSTRACT

Accurate phase switching of similar pulse trains having different phase position, in which a respectively selected pulse train determines a pulse train to be distributed by means of a phase locked loop, is achieved. Each pulse train is individually delayed so the phase position is roughly adjusted to zero with respect to the pulse train to be distributed. Each non-selected pulse train is continuously compared with the pulse train to be distributed. A phase error voltage is determined that corresponds to a phase difference still present as it would become effective as a control voltage in the phase locked loop. An oppositely equal correcting voltage is added to the phase error voltage to produce a sum, and the sum is made available as an output voltage. Switching to another pulse train is effected by maintaining the relevant correcting voltage at a momentary value and switching the associated output voltage into the phase locked loop as a control voltage in place of a previously used output voltage.

11 Claims, 3 Drawing Sheets

METHOD AND DEVICE FOR ACCURATE PHASE SWITCHING OF SIMILAR PULSE TRAINS HAVING DIFFERENT PHASE POSITIONS

BACKGROUND OF THE INVENTION

1. Field of the Invention

The invention is based on the area of processing clocked digital signals, and relates to a method and a device for accurate phase switching of similar pulse trains that have different phase positions, particularly of redundant clock signals in synchronous systems.

2. Background Information

In larger synchronous systems that include digital signal processing, the plurality of provided modules must be supplied with a clock signal derived from a single source. An example of such a system is a junction in a modern telecommunications network that is operated according to CCITT standards of synchronous digital hierarchy (SDH), a so-called SDH cross-connect. Because gap-free clock supply is vital for the function of the system, this must be assured, even if a malfunction or even a failure occurs at one or another location in the system. Therefore, it is conventional to provide redundant configuration of the clock supply arrangement and other vital system elements. The doubled or even multiple signals present are distributed on different paths in the system. Cross-connections, which can be switched immediately to one of the additionally present signals in case of an error, exist at numerous locations.

Because of the different transit times, however, the similar signals present at a module—usually square-wave signals that have a fixed fundamental frequency, i.e. divalent pulse trains—have different phase positions with respect to one another. Simple switching inevitably leads to a phase jump, the consequence of which would be erroneous countings, erroneous data transfers and the like. Aside from this, direct switching between signals during the occurrence of an error without the loss of at least some pulses is not possible. It is therefore conventional to accept delays in distributing signals. For each pulse train for which time is critical and that has a setup procedure, an individual delay is established on a single module upon which the different signals impact by way of different paths, creating favorable conditions for data processing (setup and hold times of the data with respect to the clock). A delay additionally makes it possible to bridge detected errors.

A conventional means of precise distribution of a pulse train is to generate the signal to be distributed in a phase locked loop (PLL) whose command variable is the selected signal to be distributed. The PLL is slightly impaired by individual, brief errors, but nevertheless generates a gap-free signal. If a switch is made at the PLL from the one command variable to another, similar one—identical in frequency—having a different phase position, the phase jump is prevented, but a result is a longer transient oscillation to the new phase position. However, with this new phase position, the favorable conditions attained by the setup procedure are disturbed in the temporal sequence of the decisive pulse edges, and errors can occur. Particularly in clock pulse trains, changes of this type in the phase are to be avoided during switching.

SUMMARY OF THE INVENTION

Therefore, the object of the present invention is to assure a reliable, disturbance-free clock distribution for modules with a clock that ensues from similar clock pulse trains which can arrive at the module with different transit times, and of which the one or the other can fail or be interrupted.

The object is accomplished by means of a method for accurate phase switching of similar pulse trains having different phase position, in which a respectively selected pulse train determines a pulse train to be distributed by means of a phase locked loop, including the steps of individually delaying each pulse train so the phase position is roughly adjusted to zero with respect to the pulse train to be distributed, continuously comparing each non-selected pulse train with the pulse train to be distributed, determining a phase error voltage that corresponds to a phase difference still present as it would become effective as a control voltage in the phase locked loop, adding an oppositely equal correcting voltage to the phase error voltage to produce a sum, making available the sum as an output voltage, and switching to another pulse train by maintaining the relevant correcting voltage at a momentary value and switching the associated output voltage into the phase locked loop as a control voltage in place of a previously used output voltage, and a device for accurate phase switching of similar pulse trains having different phase positions, from which a respectively selected pulse train determines the pulse train to be distributed by means of a phase locked loop, wherein a respective phase shift adjustment circuit is provided for each of the similar pulse trains, each respective phase shift circuit having an input for the respective similar pulse train, a further input for the distributed pulse train and an output for a respective output voltage, and wherein an electronic multiway switch connected at the output of each phase shift adjustment circuit for selectively switching a respective output signal into the phase locked loop. The solution is distinguished by switching inside the phase locked loop, more precisely of the control voltage of the PLL, in connection with a phase shift balancing circuit provided twice or multiple times, of which one respectively makes up the first part of the PLL. The phase shift balancing circuit is essentially the phase discriminator of the PLL, expanded by a delay that can be set and a correcting voltage that can be tracked. If the circuit is switched into the PLL, the delay and the correcting voltage remain set at the last determined value. In the other circuits, the delay is set such that the phase position is roughly balanced to zero with respect to the emitted pulse train, and the correcting voltage is continuously tracked such that it compensates the phase error voltage emitted at the phase discriminator. Switching the control voltage of the PLL is then continuously effected practically voltage-free, and essentially without a change in phase and without a phase transient oscillation process of the output pulse train.

The method is advantageously also applicable when the clock signal includes synchronizing marks for frame synchronization, as, for example, in SDH systems. In this case the problem exists that, without particular measures, each mark of this type causes a surge to the PLL, such as the occurrence of an error. Furthermore, it is significant for complete synchronization in which direction a phase difference is compensated; without additional information, a PLL will therefore compensate a phase shift of, for example, 1.7 π as well as one of –0.3π by 0.3π, by means of which a shift by an entire cycle duration of the clock results.

Disturbance-free clock distribution of the named type is also assured for clock pulse trains modulated with synchronization information in that the synchronizing marks are included in the clock generated by a PLL, which clock is insensitive to the synchronizing marks because of the result of a comparative frame monitor in the phase shift adjustment circuit. Hence, synchronization of the emitted pulse train to the correspondingly delayed, selected pulse train is possible.

The method can advantageously also be used when all similar clock pulse trains fail. A counter running with the pulse frequency counts the clock pulses generated by the PLL in the frame insertion circuit. In normal operation, the counter is set by the frame monitor in the phase shift adjustment circuit. If all similar pulse trains fail, it is free-running and self-setting when it reaches a predetermined counter state. A logic circuit influenced by the counter state inserts the synchronization information into the pulse train to be distributed.

BRIEF DESCRIPTION OF THE DRAWINGS

The invention is described in detail below by way of an application, a clock distribution inside an SDH switching distributor, in which reliable clock distribution is of particular significance. Reference is made to the following drawing figures.

DETAILED DESCRIPTION OF THE PREFERRED EMBODIMENTS

In modern telecommunications networks operated according to CCITT standards of synchronous digital hierarchy (SDH), the switching distributors in the transmission junctions, the so-called cross-connect systems, are of particular significance. Their primary task, namely to switch through the communicating digital signals of different bit rates using software-based control, must be fulfilled with high reliability, even under special circumstances such as the execution of changes in the network during operation or failure of individual functions. To be able to sufficiently meet the high requirements, the switching distributors are configured to be modular and extensively redundant. This provides for switching within the shortest time.

Figure 1:
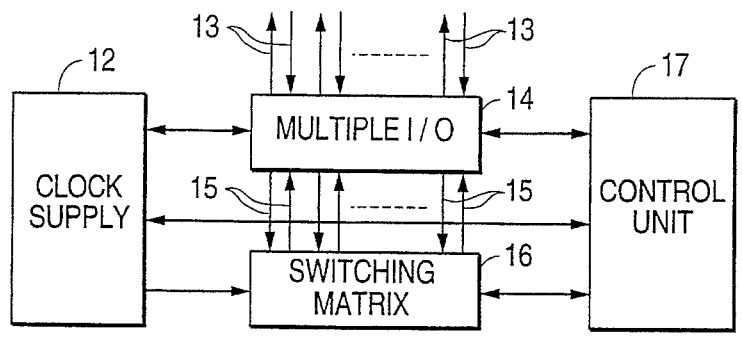
FIG. 1 shows function blocks of a switching distributor

According to FIG. 1, a switching distributor essentially comprises a multiple input/output element 14, a switching matrix 16, a control unit 17 and a clock supply arrangement 12. The electrical or visual signals travel via connecting leads 13 to a multiple input output element 14, in which the input signals are electrically processed and partly disassembled according to their structure. The parts travel via a corresponding number of data lines 15 into switching matrix 16 where they are allocated to the new outputs, and from there back to the corresponding ports of multiple input/ output element 14. The parts now present are combined there into a signal to be transmitted, and converted for transmission by way of connecting leads 13. The entire process is influenced by control unit 17, which is effected partly by a central computer and partly by local processors. Particularly significant is clock supply arrangement 12, which assures a synchronous course.

Figure 2:
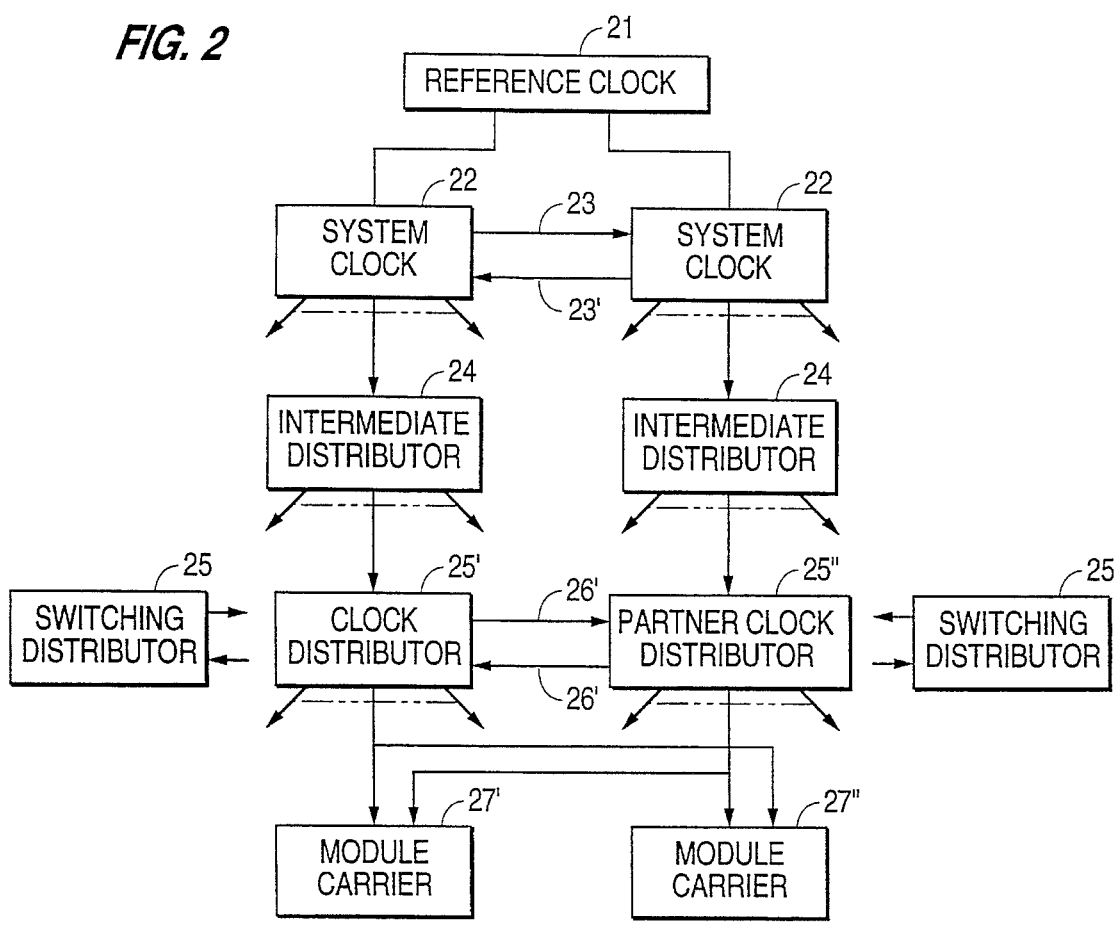
FIG. 2 shows the clock supply arrangement in the switching distributor

FIG. 2 shows this type of clock supply arrangement in more detail—it also clarifies the principle of modularity and redundancy. The reference clock, having a precise frequency of around 2 MHz, can be externally predetermined or derived from processed signals of the network; it is conducted from reference clock processing 21 to two identical system clock generators 22, which each generate the system clock of 155.5 MHz from this by means of the phase locked loop (PLL), and distribute it to further modules of the clock supply arrangement. The two system clock generators are equivalent. A constant exchange of clock information and synchronization information takes place with the partner group by way of lines 23, 23'. In case of an error, or expansion of one of the two generators, the switch is made to the clock of the other. So that this can take place undetected by the downstream modules, it must be ensured that the phase position of the two pulse trains coincide exactly prior to switching or the failure, respectively, which is accomplished by the device of precise phase switching of the invention, which is described below. If needed, a system generator 22 services a plurality of switching distributors 25 by way of intermediate distributors 24, which are omitted in smaller systems. All of these distributors are provided in duplicate and disposed over the entire system. Clock distributors 25, and 25' are in turn connected to each other in pairs by way of lines 26, 26', by way of which lines they match their clocks to one another, so that jump-free switching is also possible at these locations at any time. A clock distributor 25 services a plurality of modules 27 that are dependent upon the clock supply arrangement. Conventionally, a clock distributor 25' is provided for each module carrier. Modules 27' present in these module carriers are also serviced by partner clock distributor 25", however, and can, if needed, run at its clock. Inversely, clock distributor 25' also services modules 27" of partner clock distributor 25". In this way, all of the units are supplied with clock signals by way of two independent paths. In this case, switching is effected per the order of the control unit.

Switching distributors of the described type have, for example, 512 connecting leads for signals having 155 Mbit/ s, which requires a device whose dimensions are in meters. The transit time of the pulses is in the order of magnitude of a cycle duration of 6.4 ns of the system clock. The clock signals therefore reach the individual modules with differences in transit time that are not to be overlooked. The data again pass through the modules on different paths from those of the clock signals. At a certain location at which data and clock must cooperate again, their significant pulse edges have different delays with respect to a theoretically precise point in the cycle. These phase differences based on transit time can be roughly matched by inserting delay elements. With the aid of a variable delay line, a module can be adjusted individually.

The total transit time difference does not play a role in switching from one clock pulse train to another, redundant one of identical frequency, as long as the pulse train is congruous. However, the phase between the rectified edges in the interval $(\pi, -\pi)$ is significant. On the one hand, modulated clock signals are also provided in the cross-connect system. In those pulse trains, a pulse is suppressed every 6 ms for the purpose of frame synchronization. The suppression takes place as a function of the counter state of a clock pulse counting. During the switch from one congruous pulse train to the redundant one, this counting cannot be impaired. On the other hand, the switch cannot lead to a phase jump in the clock, the consequence of which would be that a pulse edge of a data flow that had previously been forward with respect to the cycle would suddenly follow or, or vice versa; this could make it impossible for the module to function properly. Therefore the necessity exists of adapting the clock signals of the two respectively cooperating clock distributors 25 or system generators 22 to each other at the provided switching location.

Figure 3:
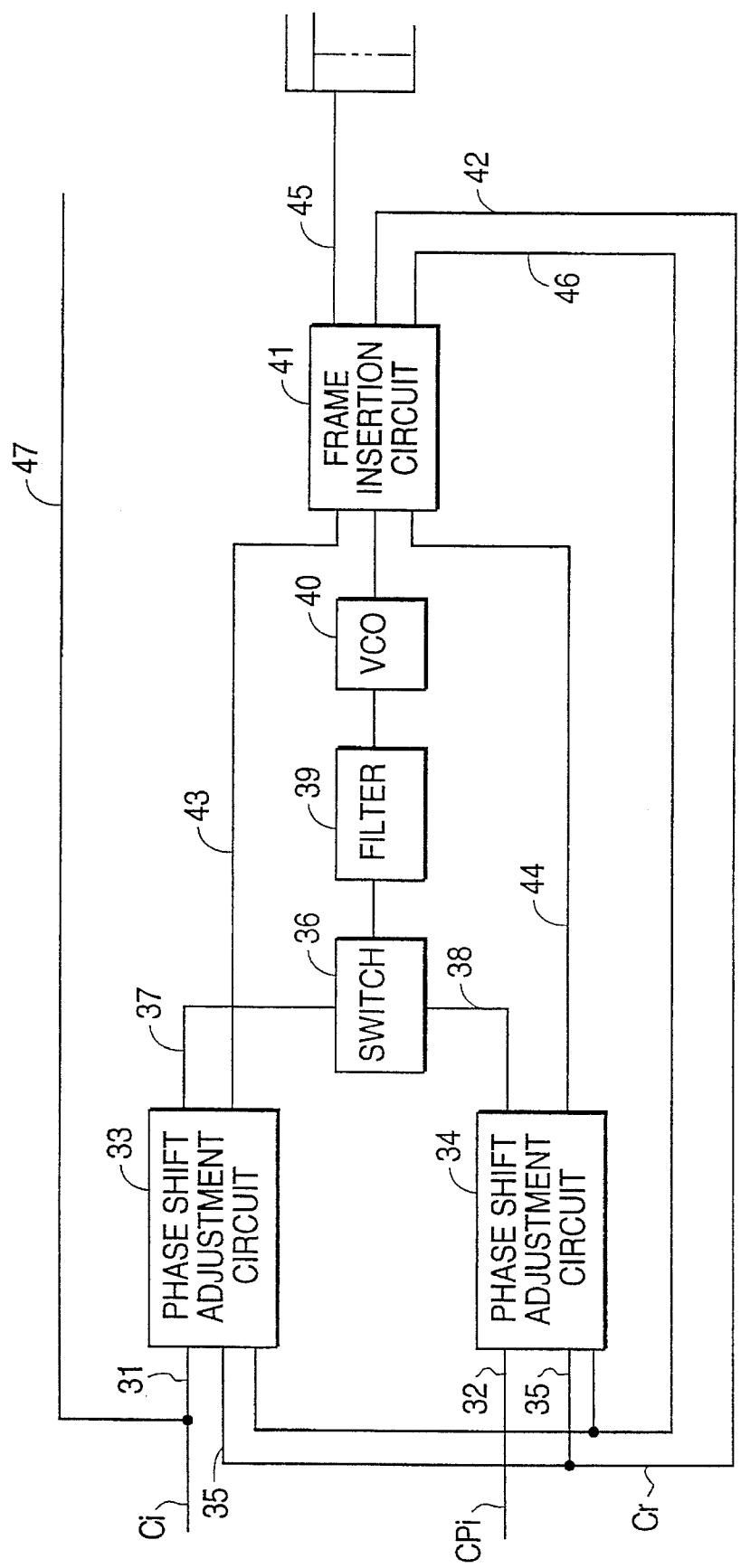
FIG. 3 is a block diagram of the decisive parts of a clock distributor

FIG. 3 shows a simplified block diagram of the significant elements of a clock distributor 25' there that permit reliable distribution of the clock: two phase shift adjustment circuits 33, 34, an electronic, analog change-over switch 36, an integrating filter 39, a voltage-controlled oscillator 40 and a frame insertion circuit 41. A first clock pulse train, hereinafter referred to as Ci, is derived from system clock generator 22 or an intermediate distributor 24, and travels to input 31. Its line forms a loop at the input of the module, and is guided by way of output 47 to partner clock distributor 25". A second clock pulse train, hereinafter referred to as CPi, is produced in the same way by partner clock distributor 25" and travels to input 32. Input 31 is part of a first phase shift adjustment circuit 33. Input 32 is part of an identical second phase shift adjustment circuit 34. A reference clock Cr, which is generated in the following significant elements of the clock distributor, is guided back to each further input 35 of the two circuits. At output 37 or 38, the circuits each deliver an analog voltage signal that is a measure for the phase shift between reference clock Cr and the first clock pulse train Ci or the second clock pulse train CPi, respectively. Output 37 of the first phase shift adjustment circuit 33 and output 38 of the second phase shift adjustment circuit 34 are each connected to an electronic, analog multiway switch 36. The respectively switched-through signal is smoothed in an integrating filter 39, and trims a voltage-controlled quartz oscillator 40. This oscillator generates an uninterrupted series of pulses of twice the frequency of the system clock, in our example 311 MHz. The subsequent frame insertion circuit 41 is a counting, logic and drive circuit. It generates reference clock Cr, which has half the frequency of the oscillator and an exact 1:1 pulse-width ratio, and travels to inputs 35 of the two phase shift adjustment circuits 33, 34 by way of feedback 42.

Superimposed over this reference clock generation by a phase locked loop, every synchronization pulse for the frame —in the example the modulation of the clock signal consists of a pulse suppression that occurs every 6 ms—is extracted in phase shift adjustment circuit 33, 34 and distributed to frame insertion circuit 41 by way of lines 43, 44. This circuit in turn generates the synchronization pulse synchronously with the extracted signal. The modulated clock signal is distributed to modules 27 by way of a driver stage at output 45. A window signal travels back to phase shift adjustment circuit 33, 34 by way of control line 46; it serves to adjust the phase in the phase shift adjustment circuit, whose output is not switched through in multiway switch 36. Further connections between phase shift adjustment circuits 33, 34, frame insertion circuit 41 and control unit 17, which primarily serve to initialize and exchange status reports, are not shown.

Together with filter 39, voltage-controlled oscillator 40 and the frequency distributor in frame insertion circuit 41, the respective phase shift adjustment circuit 33, 34, from which the signal switched through electronic, analog multiway switch 36 is derived, forms a phase locked loop by way of feedback 42 for reference clock Cr in comparison to the respective clock pulse train Ci or CPi. The modulation gap in clock pulse train Ci or CPi requires separate treatment, which is effected by frame insertion circuit 41 and its connection to phase shift adjustment circuit 33, 34 by way of further lines 43, 44. As long as at least one of the two clock pulse trains Ci or CPi is provided, the control circuit of the phase locked loop, together with that of the synchronization pulse extraction, assures a clock supply that is exactly synchronous with Ci or CPi.

The manner in which accurate phase switching to the other pulse train takes place when the one pulse train fails is described below. If CPi fails in addition to Ci or vice versa, instead of switching the last state is maintained, and clock supply is not impaired for the time being. The clock is always as precise as the quartz oscillator is stable in frequency, and the pulse suppression for frame synchronization is effected by frame insertion circuit 41. If Ci and/or CPi is later present at phase shift adjustment circuit 33, 34, synchronization with the frame clock is again produced.

Figure 4:
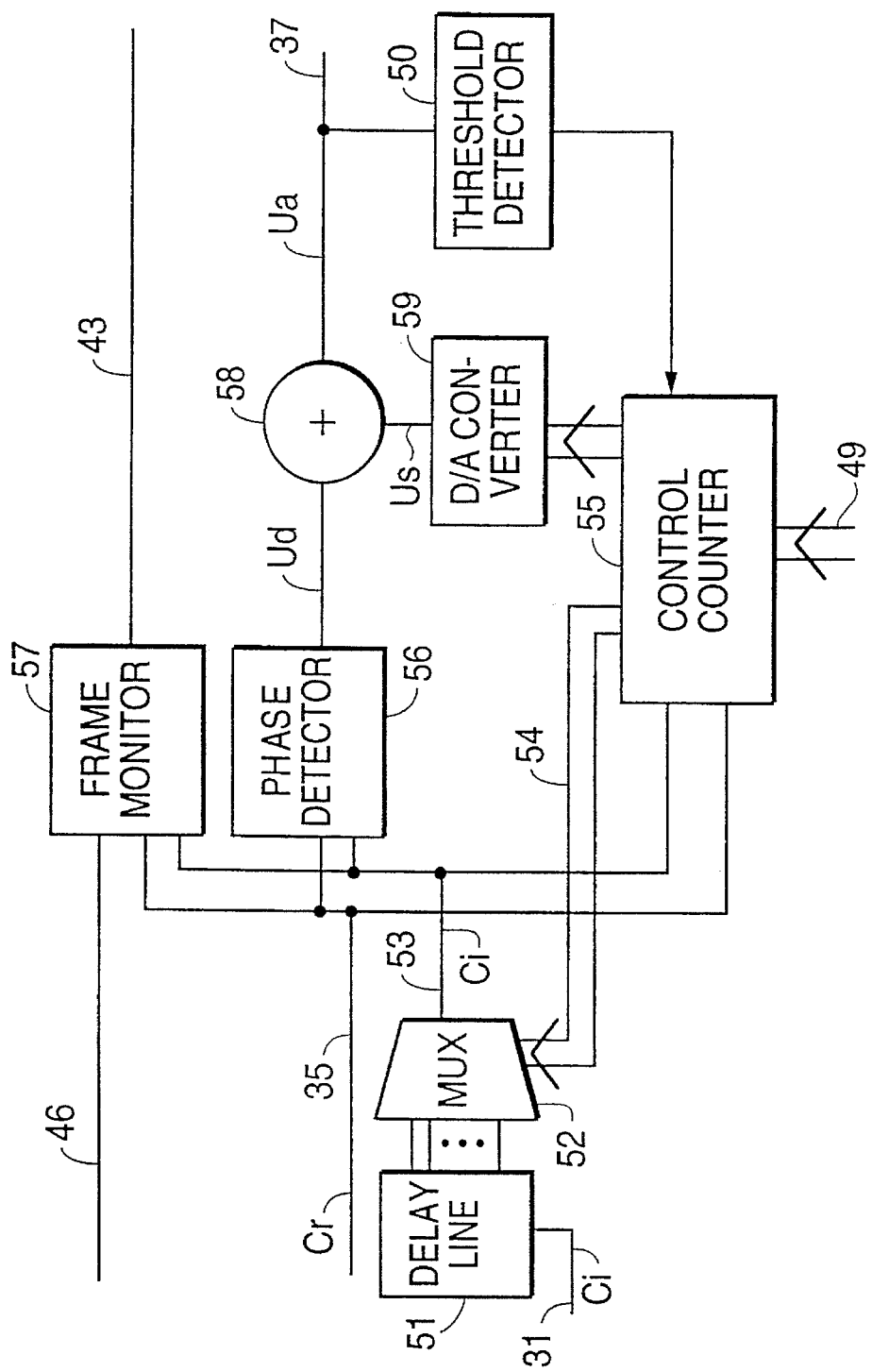
FIG. 4 is a phase shift adjustment circuit.

Phase shift adjustment circuit 33 fulfills three tasks. First, it compares the phase shift between the first clock pulse train Ci and reference clock Cr and delivers a control signal for oscillator 40. Secondly, it continuously stores the correcting value that it needs in order to adjust the control signal to zero. Thirdly, it extracts the modulation gap in Ci. Of course, the same applies for phase shift adjustment circuit 34 and clock pulse train CPi. Below, reference is only made to the two completely equivalent phase shift adjustment circuits shown in FIG. 4, even if the partner circuit is meant with respect to function. FIG. 4 shows the principle design having, among others, a delay line 51, a multiplexer 52, a control counter 55, a phase detector 56 and a frame monitor 57. The three inputs of the phase shift adjustment circuit are shown on the left, the input for the window signal fed back by way of control line 46 in the center, input 35 for reference clock Cr and, below, input 31 for clock pulse train Ci. The latter is guided by way of a temperature-compensated delay line 51 having, for example, 16 branch connections. One of the connections is switched through from a multiplexer 52 to its output 53, from which a delayed clock pulse train Ci' is distributed to three function blocks, namely frame monitor 57, phase detector 56 and control counter 55. Reference clock Cr travels to these same function blocks from input 35. The selection of the connection for switching through in multiplexer 52 is effected by the address established in control counter 55, and distribution takes place by way of address line 54 to multiplexer 52. This device permits a phase shift of the clock pulse train by approximately 1.3 clock units, thereby permitting a rough adjustment of the phase.

Phase detector 56 is configured in the manner known for phase locked loops. It may process a phase shift between the two input signals of a full 360°. The analog, filtered output voltage delivers the control signal for the voltage-controlled quartz oscillator 40, provided that output 37 is switched through by way of switch 36 (FIG. 3). For a first clock adjustment in this first operational mode, digital/analog converter 59 delivers no voltage to summatot 58, and delay circuit 51, 52 is fixed at an average value; the delayed clock pulse train Ci' at output 53 is delayed by a fixed phase amount with respect to clock pulse train Ci at output 53. Hence, this is a conventional phase locked loop that causes reference clock Cr to follow clock pulse train Ci, which is delayed by a fixed amount, between the two pulse trains; the phase between the two pulse trains and therefore also the output voltage are essentially zero.

At the same time, the second phase shift adjustment circuit operates in the second operational mode, in which output 37 is not switched through to oscillator 40. No later control of reference clock Cr to the delayed clock pulse train Ci' takes place. Rather, in this operational mode, reference clock Cr is viewed as a significant clock. In accordance with the invention, the circuit is internally conditioned such that, despite a foreseeable different phase position between reference clock Cr and delayed clock pulse train Ci', an output voltage Ua of zero results, which makes it possible to switch from the one phase shift adjustment circuit to the other at any time without a phase jump in the phase locked loop. This is accomplished in that, in the phase shift adjustment circuit not switched into the phase locked loop, one is simulated. A frequency adaptation can, of course, not be effected, but is not necessary, because the frequency is and remains the same in all cases.

Output voltage Ua at output 37 of the phase shift adjustment circuit is guided to a threshold value detector 50 that derives a logical signal from the polarity of output voltage Ua. This is significant for the counting direction in control counter 55. The counting result of a counter contained therein produces the address for multiplexer 52, and is therefore significant for the delay of clock pulse train Ci in the delayed clock pulse train Ci'. This counter operates under the control of external control signals that influence control counter 55 (setting, counting) by way of control lines 49, and a comparison circuit for the two clock signals, reference clock Cr and delayed clock pulse train Ci' (counting release). This measure effects a rough phase correction, so that phase error voltage Ud comes to lie at zero at the output of phase detector 56. Fine adjustment is effected by way of a correcting voltage Us, which contributes to output voltage Ua from digital/analog converter 59 by means of summator 58. The value of correcting voltage Us is likewise given by the state of a counter in control counter 55, which operates in a manner similar to the one described above. Correcting voltage Us is readjusted until output voltage Ua becomes zero. If necessary, the multiplexer must be addressed again to another delay. The inherently present phase position between reference clock Cr and clock pulse train Ci, not used at the moment, is therefore roughly adjusted by the adjustment of the delay, while the phase error voltage Ud that correspond to the remaining shift is compensated by a correcting voltage Us.

If switching now takes place between outputs 37 and 38 by means of multiway switch 36—for whatever reason—at the same time the counter values in the phase shift adjustment circuit which has been recently switched into the PLL are frozen in. In the ideal case, switching is effected without voltage. The PLL is not disturbed. The delay and correcting voltage Us remain unchanged, but are no longer further adjusted.

Prior to switching back into the original mode of operation, the delay and the correcting voltage Us are likewise set in the first phase shift adjustment circuit. Of course, it is to be expected that they will again come to lie at the central branch or zero. Other values as a result of ratios that have changed in the interim are also conceivable, however.

What is claimed is:

1. A method for accurate phase switching of similar pulse trains having different phase positions, in which a respectively selected pulse train determines a pulse train to be distributed by means of a phase locked loop, comprising the steps of:

individually delaying each pulse train so that a respective phase position is roughly adjusted to zero with respect to the pulse train to be distributed, continuously comparing the phase of each non-selected pulse train with the pulse train to be distributed, determining a phase error voltage that corresponds to a phase difference still present as it would become effective as a control voltage in the phase locked loop, adding an oppositely equal correcting voltage to the phase error voltage to produce a sum, making available the sum as an output voltage, and switching to another pulse train by maintaining a relevant correcting voltage at a momentary value and switching an associated output voltage into the phase locked loop as a control voltage in place of a previously used output voltage.

2. A method as defined in claim 1, wherein synchronizing marks are present in the similar pulse trains, and wherein the synchronizing marks are present in the pulse train to be distributed.

3. A method as defined in claim 2, wherein the step of continuously comparing the phase of each non-selected pulse train includes comparing the synchronizing marks present in respective pulse trains to detect and correctly compensate phase shifts of more than one pulse width.

4. A method as defined in claim 1, further comprising the step of switching the control voltage to zero during a failure of all similar pulse trains, wherein the pulse train to be distributed is further generated with a frequency that deviates insignificantly from a last-used frequency.

5. A method as defined in claim 4, further comprising the step of generating with a counter running with the pulse frequency, the synchronizing marks included in the pulse train to be distributed.

6. A method as defined in claim 2, further comprising the step of switching the control voltage to zero during a failure of all similar pulse trains, wherein a pulse train to be distributed is further generated with a frequency that deviates insignificantly from a last-used frequency.

7. A method as defined in claim 6, further comprising the step of generating with a counter running with the pulse frequency, the synchronizing marks included in the pulse train to be distributed.

8. A device for accurate phase switching of similar pulse trains having different phase positions, from which a respectively selected pulse train determines a pulse train to be distributed by means of a phase locked loop, comprising:

a respective phase shift adjustment circuit for each of the similar pulse trains, each respective phase shift circuit having an input for a respective similar pulse train, a further input for a distributed pulse train and an output for a respective output voltage; and an electronic multiway Switch connected at the output of each phase shift adjustment circuit for selectively switching a respective output signal into the phase locked loop;

wherein each respective phase shift adjustment circuit comprises:

a discretely adjustable delay line for receiving and delaying the respective similar pulse train, a phase discriminator for producing a phase error voltage dependent on a phase difference between the delayed respective similar pulse train and the distributed pulse train, and a trackable voltage source for superimposing a correcting voltage on the phase error voltage which compensates the phase error voltage, as long as the phase shift adjustment circuit is not switched into the phase locked loop by means of the electronic multiway switch, said correcting voltage being maintained at a last adjusted value.

9. A device as defined in claim 8, wherein each respective phase shift adjustment circuit further comprises a multiplexer circuit, wherein the discretely adjustable delay line outputs the pulse train as a plurality of discretely delayed pulse trains to the multiplexer circuit, wherein the multiplexer circuit is adjusted automatically based on a phase comparison to output one of the plurality of discretely delayed pulse trains such that a smallest possible phase shift results, and wherein the multiplexer circuit output is maintained at the last adjusted value when the phase shift adjustment circuit is switched into the phase locked loop.

10. A device for accurate phase switching of similar pulse trains having different phase positions, from which a respectively selected pulse train determines a pulse train to be distributed by means of a phase locked loop, comprising:

a respective phase shift adjustment circuit for each of the similar pulse trains, each respective phase shift circuit having an input for a respective similar pulse train, a further input for a distributed pulse train and an output for a respective output voltage;

an electronic multiway switch connected at the output of each phase shift adjustment circuit for selectively switching a respective output signal into the phase locked loop; and a frame insertion circuit in the phase locked loop, the frame insertion circuit including a counter, wherein, depending on the state of the counter, synchronizing marks are inserted into the pulse train to be distributed so that, even if all of the similar pulses fail, a complete pulse train to be distributed is generated.

11. A device as defined in claim 10, wherein the frame insertion circuit is connected to each phase shift adjustment circuit by a control line through which synchronizing signals are exchanged, and wherein the phase shift adjustment circuit includes a frame monitor for synchronizing the frame insertion circuit to a frame clock.

* * * * *

UNITED STATES PATENT AND TRADEMARK OFFICE
CERTIFICATE OF CORRECTION

PATENT NO. : 5,475,719
DATED : December 12, 1995
INVENTOR(S) : Michal O. GÜRTLER and Rolf BEERENWINKEL It is certified that error appears in the above-indentified patent and that said Letters Patent is hereby corrected as shown below:

On the title page:

Item: [75] Inventors:

Please change "Michael O. Gürtler" to --Michal O. Gürtler--.

Signed and Sealed this

Thirteenth Day of August, 1996

Attest:

BRUCE LEHMAN

*Attesting Officer*     *Commissioner of Patents and Trademarks*